(12) United States Patent
Inha et al.

(10) Patent No.: US 8,362,654 B2
(45) Date of Patent: Jan. 29, 2013

(54) ELECTRONIC DEVICE INTERFACE SWITCHING SYSTEM

(75) Inventors: Kai Inha, Jarvenpaa (FI); Juha Backman, Espoo (FI)

(73) Assignee: Nokia Corporation, Espoo (FI)

(*) Notice: Subject to any disclaimer, the term of this patent is extended or adjusted under 35 U.S.C. 154(b) by 649 days.

(21) Appl. No.: 12/313,629

(22) Filed: Nov. 21, 2008

(65) Prior Publication Data

US 2009/0130910 A1  May 21, 2009

Related U.S. Application Data

(63) Continuation of application No. PCT/IB2007/003713, filed on Nov. 30, 2007.

(60) Provisional application No. 61/003,986, filed on Nov. 21, 2007.

(51) Int. Cl.
*B23K 11/24* (2006.01)
*G06F 13/00* (2006.01)

(52) U.S. Cl. ........................................ 307/112; 710/316

(58) Field of Classification Search .................. 307/112; 439/188; 710/316; 1/112; 381/58
See application file for complete search history.

(56) References Cited

U.S. PATENT DOCUMENTS

| 6,178,514 B1* | 1/2001 | Wood ............................ 713/300 |
| 6,979,231 B2* | 12/2005 | Shinohara ..................... 439/669 |
| 7,836,216 B2* | 11/2010 | Kashi et al. .................... 710/15 |
| 2003/0144040 A1 | 7/2003 | Liu et al. ........................ 355/568 |
| 2007/0263750 A1 | 11/2007 | Ou et al. ........................ 375/315 |

FOREIGN PATENT DOCUMENTS

| EP | 1 318 576 A1 | 6/2003 |
| WO | WO-2006/045617 A2 | 5/2006 |

* cited by examiner

*Primary Examiner* — Michael Rutland Wallis
(74) *Attorney, Agent, or Firm* — Harrington & Smith

(57) ABSTRACT

Disclosed herein is an apparatus. The apparatus includes a first connector and a switching system. The first connector is configured to receive a second connector having a first contact area and a second different contact area. The switching system is connected to the first connector. The switching system is configured to alternatively connect a ground of the apparatus to the first or the second contact area.

21 Claims, 11 Drawing Sheets

ELECTRONIC DEVICE INTERFACE SWITCHING SYSTEM

CROSS REFERENCE TO RELATED APPLICATION

This application is a continuation of International Application No. PCT/IB2007/003713, filed Nov. 30, 2007 which is hereby incorporated by reference in its entirety. This application also claims priority under 35 U.S.C. §119(e) to U.S. provisional patent application No. 61/003,986 filed Nov. 21, 2007 which is hereby incorporated by reference in its entirety.

BACKGROUND

1. Field of the Invention

The invention relates to an electronic device and, more particularly, to an interface switching system for an electronic device.

2. Brief Description of Prior Developments

As electronic devices continue to become more sophisticated, these devices provide an increasing amount of functionality. Many of these devices include connector interfaces allowing for peripheral components to be connected to the device and/or communication to other electronic devices. Circular connectors have been the most commonly used contact for multiple audio devices, including microphones, headphones, line-level audio outputs as well as video outputs. The circular connector may be an analog 2.5 mm or 3.5 mm headset or headphone connector, for example.

Basic mechanical dimensions of the connectors are reasonably well defined in different industry standards. As a consequence of the large number of applications and lack of binding standards in audio and telecommunications, the actual number of electrical contacts and their use varies from application to application. One example is the Open Mobile Terminal Platform (OMTP) standard for the pin order within the connector. Referring now to a circular connector or connector plug 26 shown in FIG. 2, the OMTP standard configuration includes Ground (GND) signal connected to a pin (or contact area) 28, a microphone signal connected to a pin (or contact area) 30, a right audio output signal connected to a pin (or contact area) 32, and a left audio output signal connected to a pin (or contact area) 34. In CDMA phones the standard requirement is to connect the ground signal to the pin 28, the left audio output to the pin 30, the right audio output to the pin 32, and the microphone signal to the pin 34. In another commonly used configuration (or alternative pinout configuration) the microphone signal is connected to the pin 28, the ground signal to the pin 30, the right audio out signal to the pin 32, and the left audio out signal to the pin 34.

This incompatibility leads to several different consequences when connecting devices with connectors of differing standards. For example, some basic functions may be available, but full functionality of the device may be lacking (such as stereo or mono audio outputs work, but the microphone or video outputs are inoperable). In another example, the functionality of the device may be too limited for practical use (such as only one audio channel of a stereo headphone available). In yet another example, there may be no functionality whatsoever (such as no audio output or input, or strong interference signals in the headphones).

Accordingly, there is a desire to provide an improved electronic device interface system.

SUMMARY

In accordance with one aspect of the invention, an apparatus is disclosed. The apparatus includes a first connector and a switching system. The first connector is configured to receive a second connector having a first contact area and a second different contact area. The switching system is connected to the first connector. The switching system is configured to alternatively connect a ground of the apparatus to the first or the second contact area.

In accordance with another aspect of the invention, an apparatus is disclosed. The apparatus includes a connector socket and a switching system. The connector socket is configured to alternatively receive a first connector plug having a first electrical configuration pattern and a second connector plug having a second different electrical configuration pattern. The switching system is connected to the connector socket. The switching system is configured to output a third electrical configuration pattern when the first connector plug is received in the socket. The switching system is configured to output the same third electrical configuration pattern when the second connector plug is received in the socket.

In accordance with another aspect of the invention, a method is disclosed. A housing section is provided. Electronic circuitry is installed in the housing section. A first connector is connected to the housing section. The first connector is configured to receive a second connector having a first contact area and a second different contact area. A switching system is connected to the first connector. The switching system is configured to alternatively connect a ground of the electronic circuitry to the first or the second contact area.

In accordance with another aspect of the invention, a method is disclosed. A housing section is providing. Electronic circuitry is installed in the housing section. A connector socket is connected to the housing section. The connector socket is configured to alternatively receive a first connector plug having a first electrical configuration pattern and a second connector plug having a second different electrical configuration pattern. A switching system is connected to the connector socket. The switching system is configured to output a third electrical configuration pattern when the first connector plug is received. The switching system is configured to output the same third electrical configuration pattern when the second connector plug is received.

In accordance with another aspect of the invention, a method is disclosed. A circuit pattern of contact areas of a connector plug received at a connector socket of an electronic device is detected. Electrical connections within the electronic device are switched based on the detected circuit pattern. The connector plug is electrically connected to the electronic device through the switched electrical connections.

In accordance with another aspect of the invention, a program storage device readable by a machine, tangibly embodying a program of instructions executable by the machine for performing operations to provide a connection between a first device and a second device is disclosed. A circuit pattern of contact areas of a connector plug received at a connector socket of the first device is detected. The connector plug is connected to a second device. Electrical connections within the first device are switched based on the detected circuit pattern. The second device is electrically connected to the first device through the switched electrical connections.

BRIEF DESCRIPTION OF THE DRAWINGS

The foregoing aspects and other features of the invention are explained in the following description, taken in connection with the accompanying drawings, wherein.

DETAILED DESCRIPTION

Figure 1:
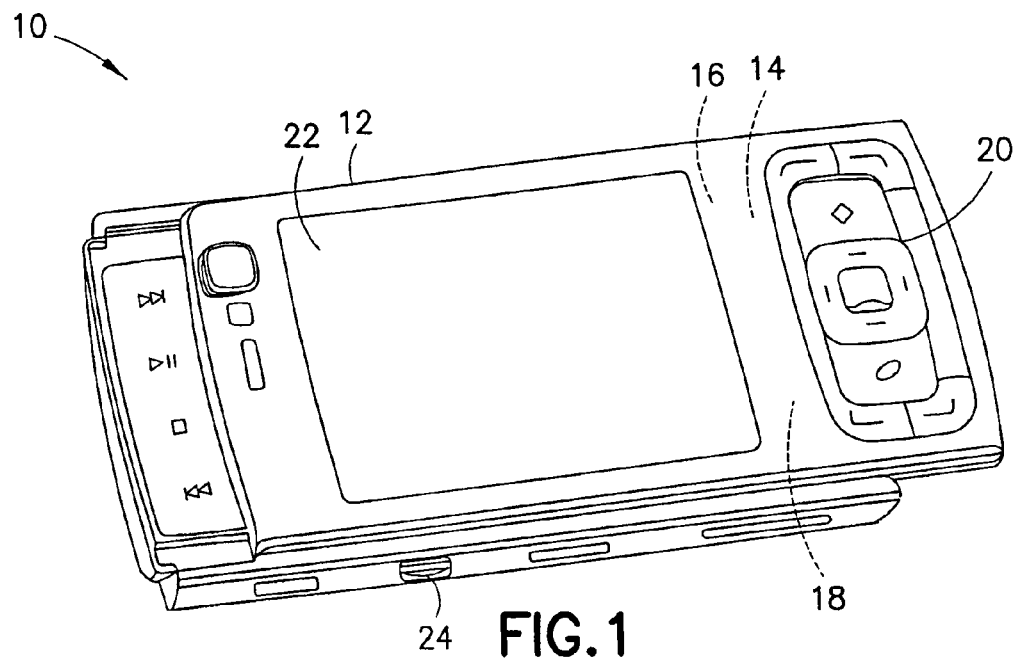
FIG. 1 is a perspective view of an electronic device comprising features of the invention.

Referring to FIG. 1, there is shown a perspective view of an electronic device 10 incorporating features of the invention. Although the invention will be described with reference to the exemplary embodiments shown in the drawings, it should be understood that the invention can be embodied in many alternate forms of embodiments. In addition, any suitable size, shape or type of elements or materials could be used.

In this exemplary embodiment the device 10 is a multi-function portable electronic device. However, in alternate embodiments, features of the exemplary embodiment of this invention could be used in any suitable type of hand-held portable electronic device such as a mobile phone, a gaming device, a music player, or a PDA, for example. In addition, as is known in the art, the device 10 can include multiple features or applications such as a camera, a music player, a game player, or an Internet browser, for example. The device 10 generally comprises a housing 12, a transceiver 14 connected to an antenna 16, electronic circuitry 18, such as a controller and a memory for example, within the housing 12, a user input region 20 and a display 22. The display 22 could also form a user input section, such as a touch screen. The housing 12 also includes a connector socket (or jack) 24. It should be noted that in alternate embodiments, the device 10 can have any suitable type of features as known in the art.

Figure 2:
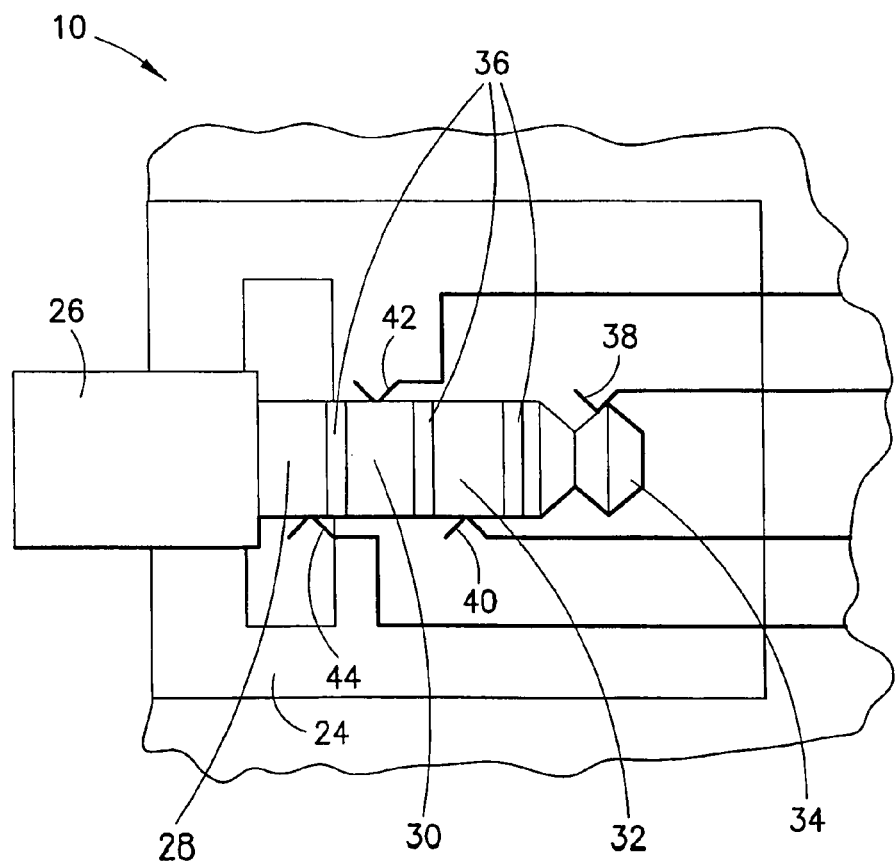
FIG. 2 is an enlarged view of a connector socket of the electronic device shown in FIG. 1.

Referring now also to FIG. 2, the connector socket 24 is configured to receive a connector plug 26 of another component, such as a headset for example. The connector plug may be a circular connector such as a 2.5 mm or 3.5 mm connector commonly used for audio/video connections, for example. However, the connector socket may be configured to receive any suitable type of connector plug. The connector plug generally comprises contact areas 28, 30, 32, 34 spaced along a length of the connector. The contact areas are generally separated by an insulating material 36 to keep the areas separate from each other.

In one configuration compatible with applicable OMTP standards as per 2007, the first contact area 28 provides a ground signal, the second contact area 30 provides a control/microphone signal, the third contact area 32 provides a right audio channel signal, and the fourth contact area 134 provides a left audio channel signal. The configuration of the contact areas provides an electrical configuration pattern (or circuit pattern) for the connector plug. However, different industry standards may provide other contact area, or pinout, locations. For example, in a second configuration (which hereinafter may be also be referred to as an alternative pinout configuration), the first contact area provides a microphone or video signal, the second contact area provides a ground signal, the third contact area provides a right audio channel signal, and the fourth contact area provides a left audio channel signal. In another example, such as a "Standard AV" configuration, the first contact area provides a right audio channel signal, the second contact area provides a ground signal, the third contact area provides a video signal, and the fourth contact area provides a left audio channel signal. In yet another example, such as a CDMA arrangement configuration (shown in FIG. 15), the first contact area provides a ground signal, the second contact area provides a left audio channel signal, the third contact area provides a right audio channel signal, and the fourth contact area provides a microphone/switch signal. These are only some examples and it should be understood that many other pinout configurations or circuit patterns may be provided.

The connector socket 24 comprises mating contact areas 38, 40, 42, 44 configured to be electrically connected with the connector plug contact areas when the connector plug is received by the connector socket. The mating contact area 38 is configured to contact the fourth contact area 34. The mating contact 40 area is configured to contact the third contact area 32. The mating contact area 42 is configured to contact the second contact area 30. The mating contact area 44 is configured to contact the first contact area 28. It should be understood that although the figures illustrate plug configurations having four contact areas (and thus a circuit pattern with four conductors), alternate embodiments may provide a connector socket configured to receive a connector plug having more or less contact areas/conductors.

Figure 3:
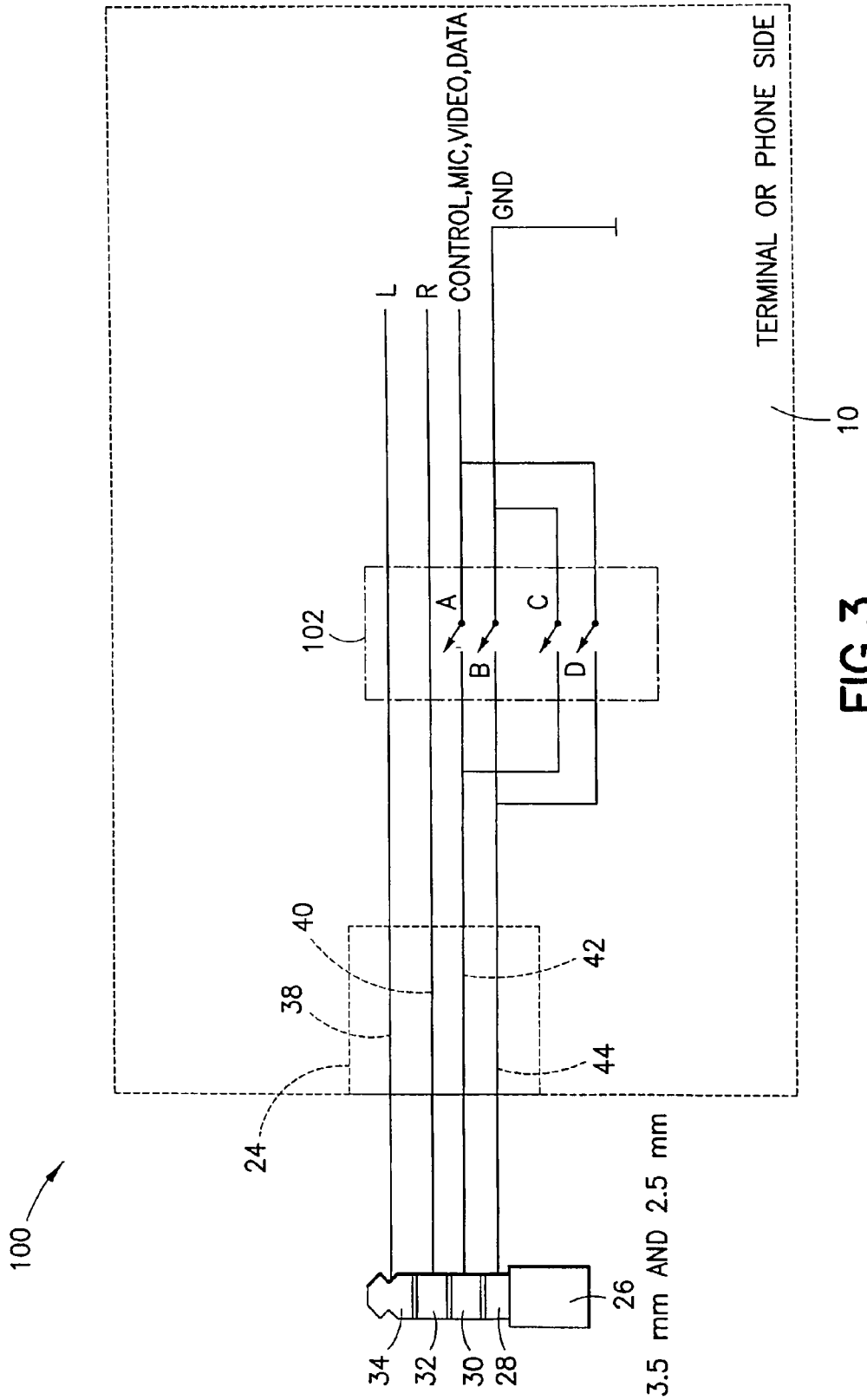
FIG. 3 is a schematic diagram of an exemplary switching system used in the electronic device shown in FIG. 1.

Referring now also to FIG. 3, a switching system 100 in accordance with a first embodiment is disclosed. For the purposes of clarity, the connector socket 24 is shown with hidden lines. When the connector plug 26 is received in the connector socket 24, the contact areas of the connector plug 28, 30, 32, 34 are electrically connected to the mating contact areas 38, 40, 42, 44 of the connector socket 26. The mating contact areas 38, 40, 42, 44 of the connector socket 24 are connected to a switching system 100 in the device 10. The switching system 100 is an automatic pin switching arrangement configured to allow for the connection of different industry standard connector plugs having different circuit patterns to be connected to the same connector socket 24.

The switching system 100 isolates the signal at the mating contact 42 and the signal at the mating contact 44 from the device ground by inserting a switch element therebetween. This switching system may comprise a MicroElectro Mechanical System (MEMS) switch 102 that can provide down to about a 10 milliohms on-resistance and up to about 60 dB isolation. However, in an alternate embodiment a Field Effect transistor (FET) and/or a transistor (N-channel or NPN) can be considered (instead of the MEMS switch) for cost critical, non perfect cases like headset connection only (no TV-out). Analogue switches A, B, C, D within the switching system enable connectivity to the different signal connections. Although FIG. 3 illustrates the switches connected between the device and the contact areas 42, 44, alternative embodiments may be extended to include additional switches connected to the other contact areas 38, 40, (as needed to accommodate the functionality per applications, such as a TV-out signal for example). In addition, software to control the output L & R channel audio output amplifies and to read microphone (mic) input may be implemented as needed to control the MEMS switches (or FET or NPN transistors) respectively. An algorithm may also be incorporated to be run by the software to solve the right pinout and to enable usecase match between the two connected devices or a device and an enhancement (headset, headphone, speakers, car, etc).

The switches A, B and switches C, D may be opened or closed to provide the desired connection. For example, if the device detects an OMTP pinout configuration (as mentioned above having a ground signal at the first contact area 28 and a control/microphone signal at the second contact area) received within the connector socket 24, switches A and B will be closed. If the device detects the second pinout configuration (as mentioned above having a control/video signal at the first contact area 28 and a ground signal at the second contact area 30) received within the connector socket 24, switches C and D will instead be closed. This provides for the proper routing of the ground and control signals between the connector plug 26 and the device 10.

By changing the position of the ground connection (through the switching system 100), a desired solution is provided as a mismatch of the ground signals generally leads to the total non-functionality of the device or peripheral connected to the connector plug 24.

Many conventional plug configurations are based on the "long ground "GND" pin" convention, which has provided compatibility in most use cases. When portable terminals or devices are connected to combinations of 2.5 mm and 3.5 mm connector plugs (such as 2.5 mm CDMA pinout, 2.5 mm and 3.5 mm OMTP pinout, and 3.5 mm alternative pinout configuration) in four conductor arrangements, dramatic customer confusion may occur as these devices become non-functional due to mismatched or misaligned signals.

The disclosed switching system may be controlled by an algorithm to provide the required pin (or signal) match. This may be provided as an automatic (or as user menu selectable) feature.

Figure 4:
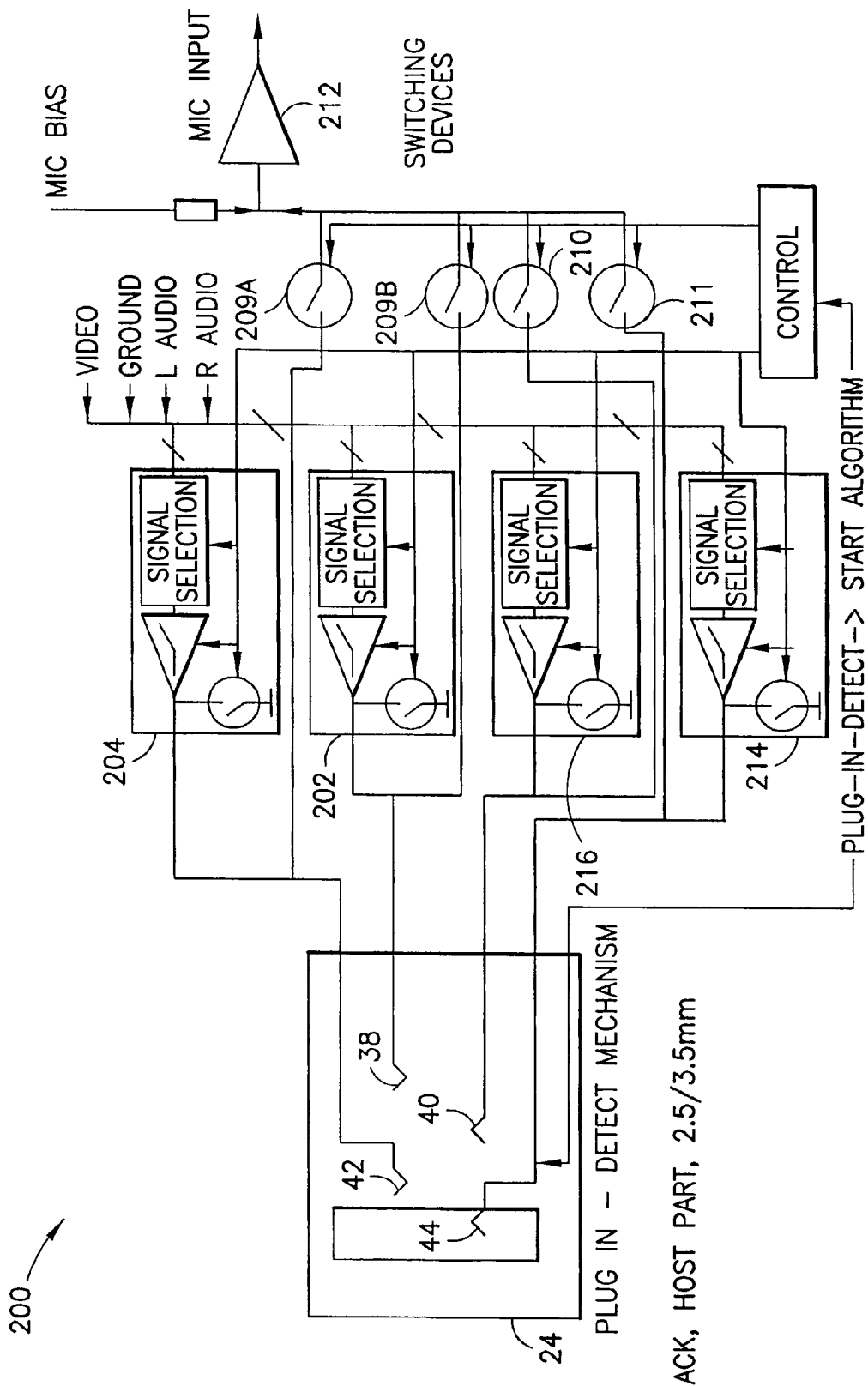
FIG. 4 is a schematic diagram of another exemplary switching system used in the electronic device shown in FIG. 1

Referring now also to FIG. 4, a switching system 200 in accordance with a second embodiment is illustrated. The switching system 200 comprises a right channel audio amplifier (optional output switch) 202, a left channel audio amplifier (optional output switch) 204, a ground amplifier (optional output switch) 214, a video amplifier (optional output switch) 216, microphone input isolation switch devices 209A, 209B, 210, 211, a microphone input amplifier 212, and the headphone/headset output jack 24. The switching system illustrates a configuration where substantially any connector plug combination is possible. This configuration provides alternative possibilities for creating a ground signal both through a switching device and by an actively driven amplifier with zero input.

It should be noted that the controllable blocks may, but do not all need, audio and/or video amplifier, active ground through amplifier, and/or connection to the terminal ground through a switching device. In some implementations it may be preferred to replace one or more blocks with fixed connections.

Figure 5:
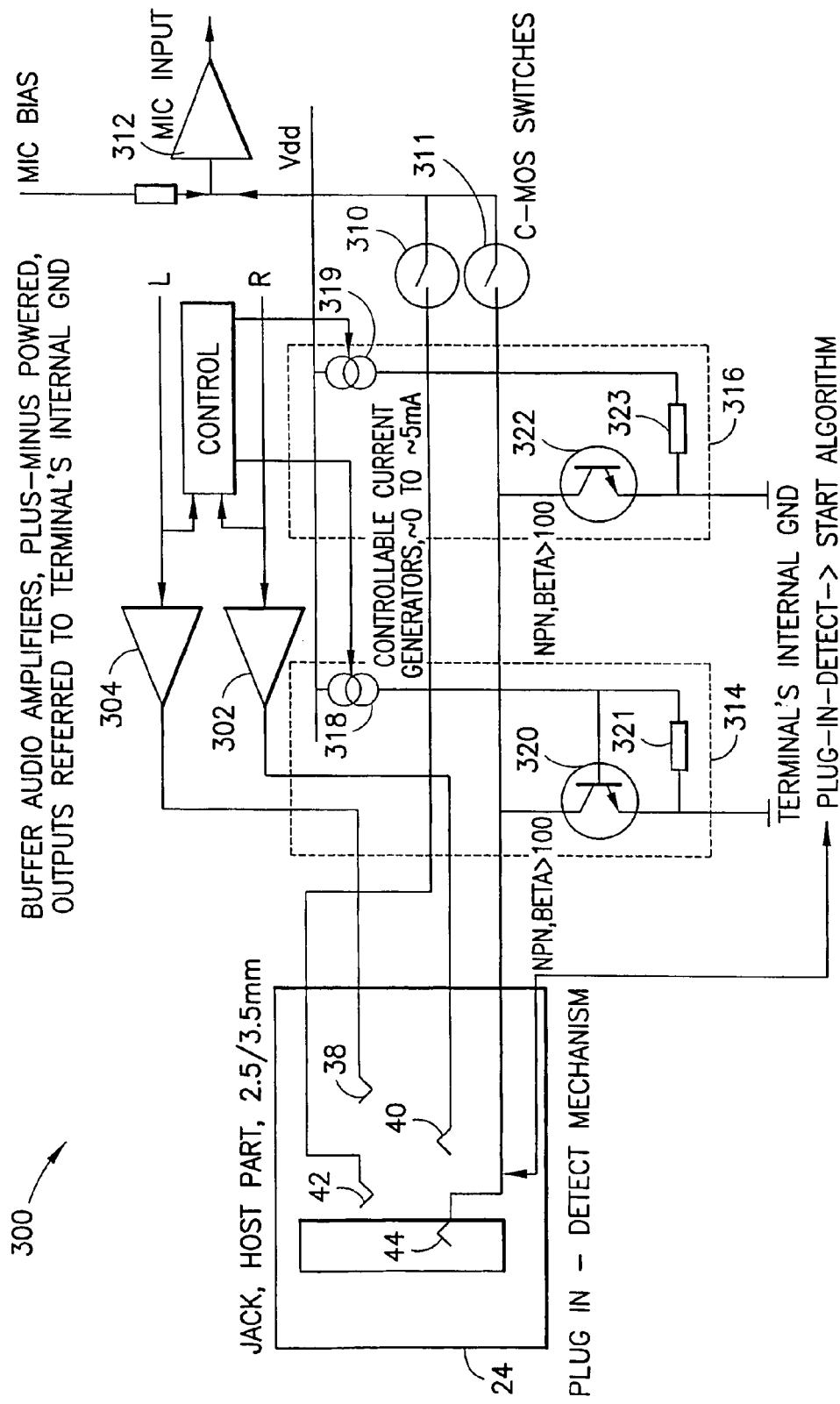
FIG. 5 is a schematic diagram of another exemplary switching system used in the electronic device shown in FIG. 1.

Referring now also to FIG. 5, a switching system 300 in accordance with a third embodiment is illustrated. Similar to the system 200, the system 300 comprises a right channel audio amplifier (optional output switch) 302, a left channel audio amplifier (optional output switch) 304, microphone input isolation switch devices 310, 311, a microphone input amplifier 312, and the headphone/headset output jack 24. The system 300 further comprises a switchable ground connection 314 for pin 3 (which may be contact area 28 or 30 for example), comprising a controllable current source 318, a transistor 320, and a resistor 321, and a switchable ground connection 316 for pin 4 (which may be contact area 28 or 30 for example), comprising a controllable current source 319, a transistor 322, and a resistor 323.

The system 300 provides a cost-effective practical implementation covering a large variety of practical telecommunications applications, such as the standard OMTP pinout configuration and the second configuration (alternative pinout configuration). Functionality may be somewhat limited with respect to the system 200 configuration by using fixed signal wiring to most common phone headset/microphone configurations. Large drive current requirements of the bipolar switching transistors may necessitate the use of a specific signal-dependent control circuit.

The system 300 provides a transistor base bias drive. From the left and the right outgoing audio signals, a bias current control is to be rectified for current generators 318, 319 in such a manner that positive sum signal of L & R (referred to as internal GND) can cause a slight increase in the transistor(s) 320, 322 base current in order to maintain good saturation, while a negative sum signal of the same, cause a higher bias current to compensate NPN transistors 320, 322 weak capability to cope with negative collector signals. As a rule of thumb, the transistor(s) 320, 322 positive base bias current in case of negative outgoing sum of L & R outlets, should be equal to or higher than the sum returning negative GND current of L & R signals. When no Outgoing signal, base current can be minimized to sub mA-level.

Figure 6:
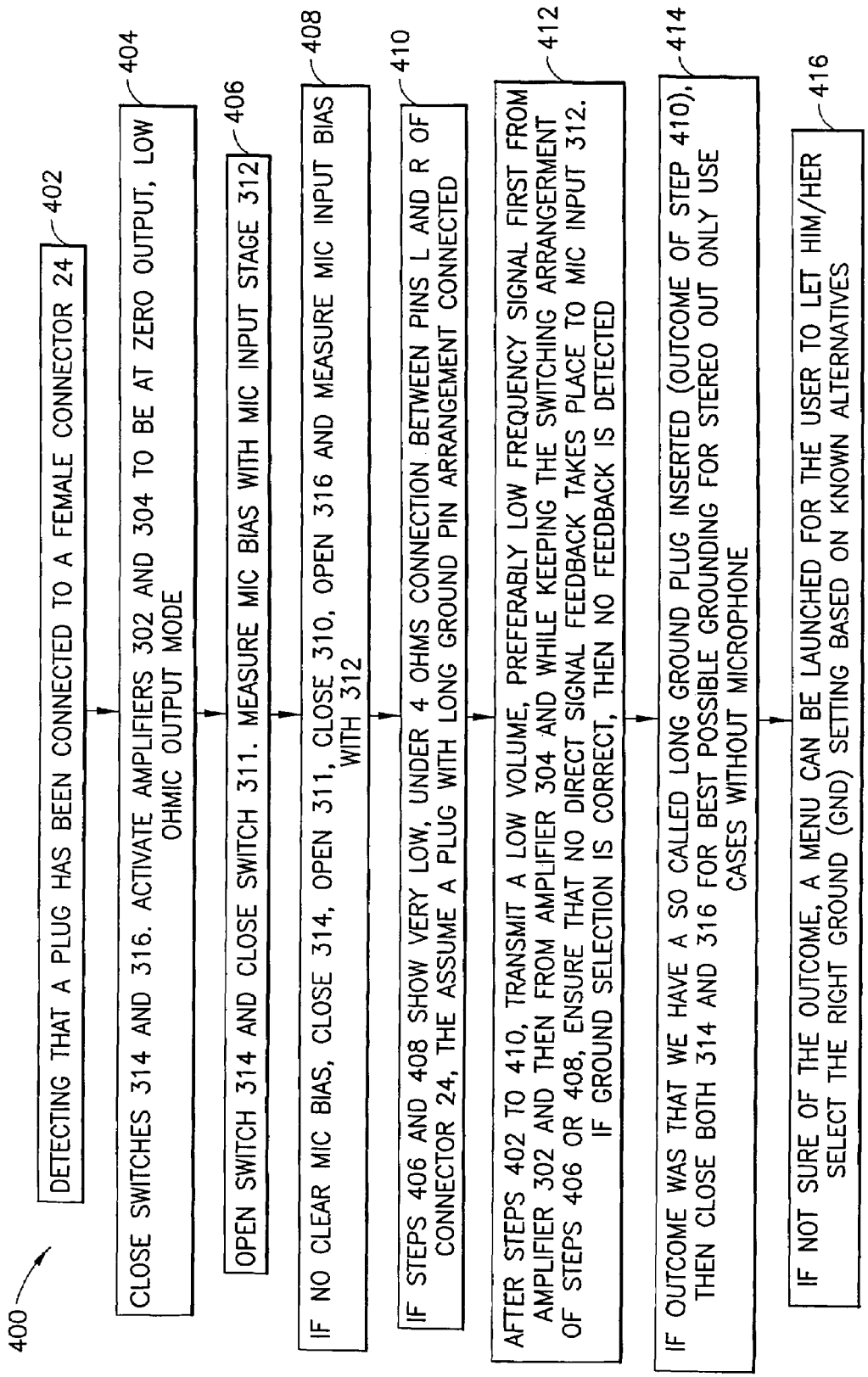
FIG. 6 is a block diagram of an exemplary algorithm used in the electronic device shown in FIG. 1.

An exemplary ground selection algorithm 400 is illustrated in FIG. 6 and described below. This description is just one method and any other suitable algorithm may be provided. There may be other algorithms, sequences or modifications to the arrangement or order of these steps to support the invention. Note: closing a switch or a transistor mean: make it conductive: 1) Selection between OMTP arrangement and the second configuration arrangement. 2) Detection of an adapter with an open other end.

Figure 7:
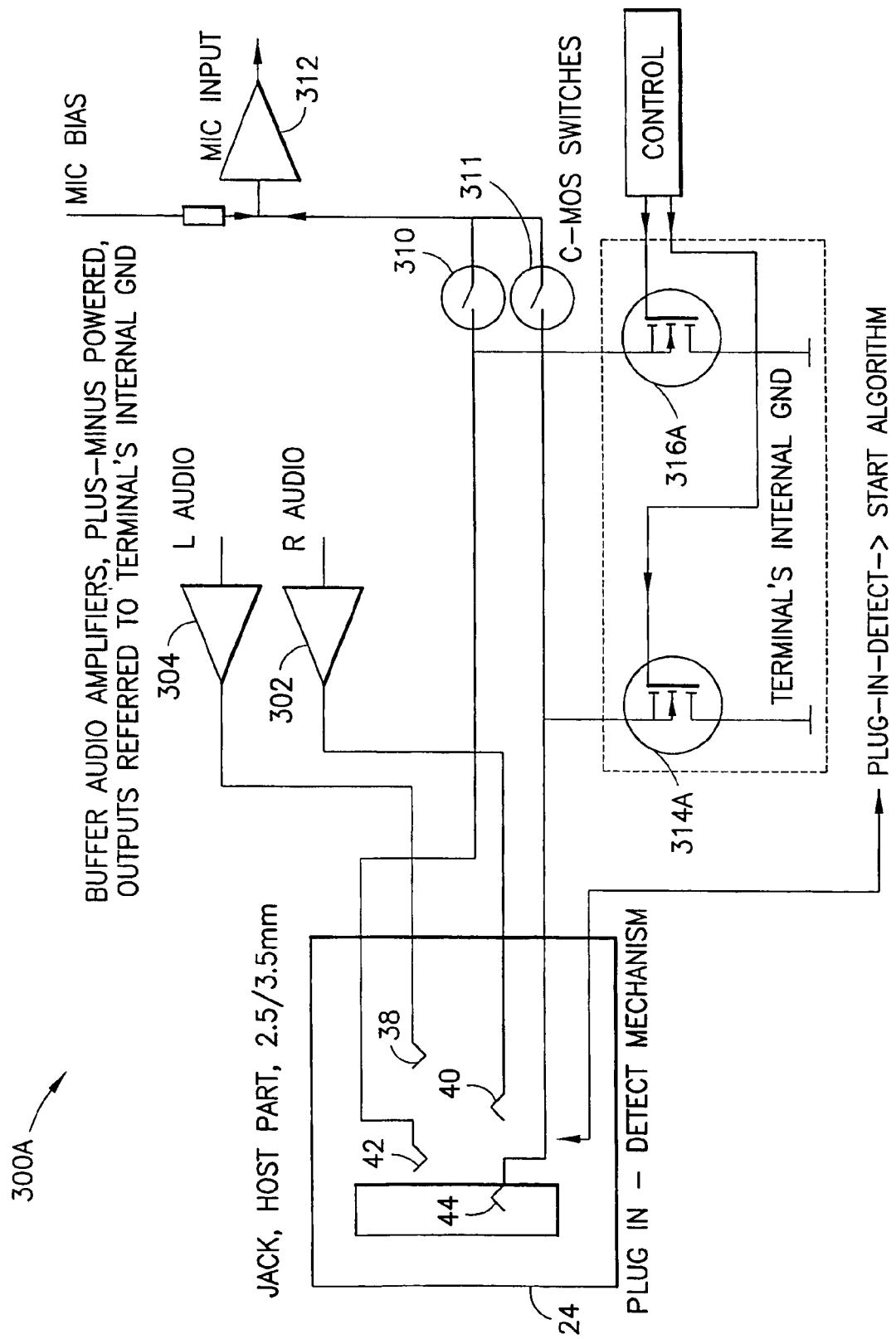
FIG. 7 is a schematic diagram of another exemplary switching system used in the electronic device shown in FIG. 1.
Figure 8:
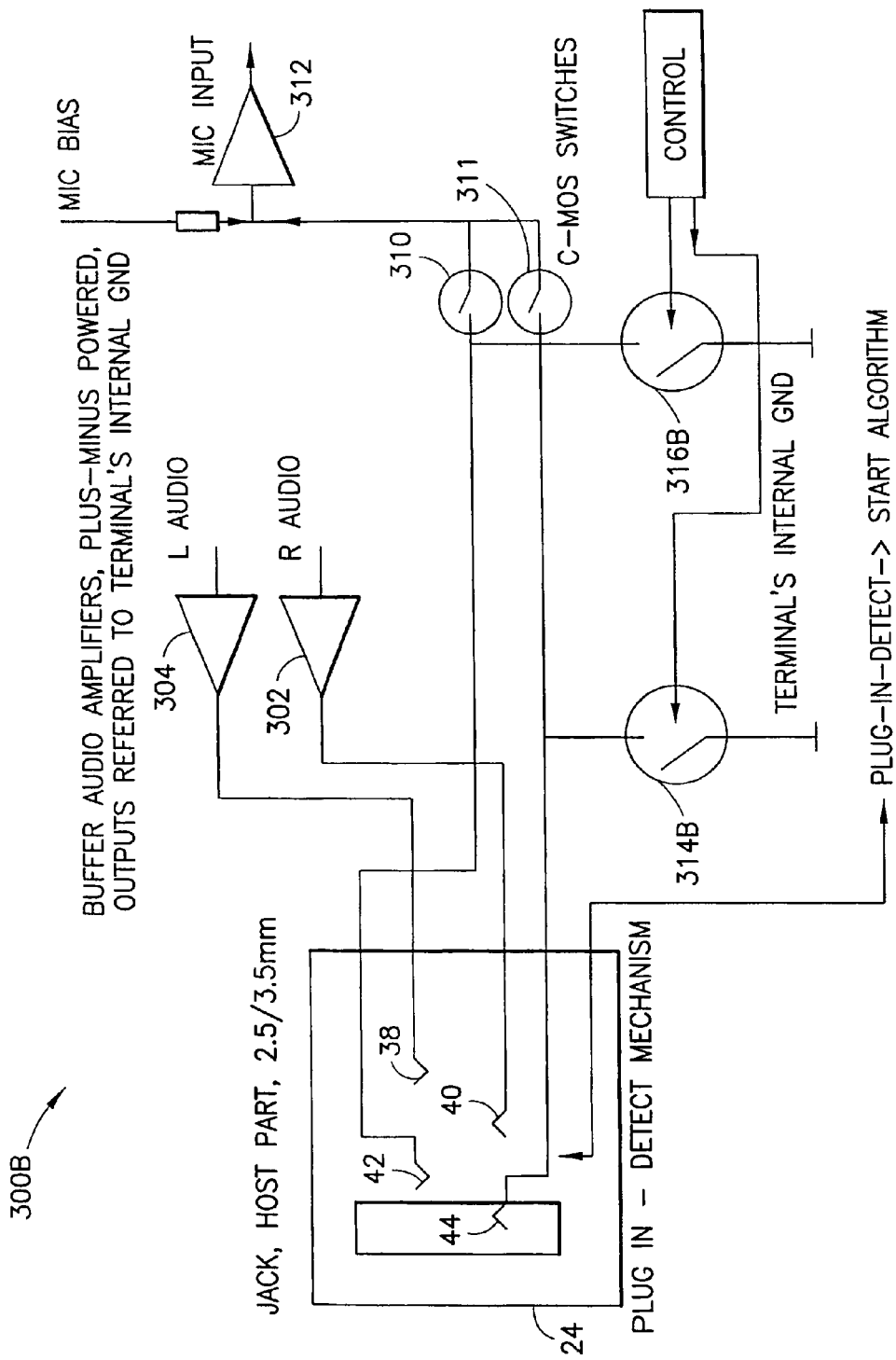
FIG. 8 is a schematic diagram of another exemplary switching system used in the electronic device shown in FIG. 1.

The algorithm 400 may be provided for other switching systems (such as systems 300A and 300B shown in FIGS. 7 and 8 for example). Step 402—Mechanical or electrical or optical or other method of detecting that a plug has been connected to the connector 24. Step 404—Close switches 314, 316. Activate amplifiers 302, 304 to be at zero output, low ohmic output mode. Step 406—Open switch 314 and close switch 311. Measure mic bias with mic input stage 312. If mic bias normal, then most likely it is the alternative pinout configuration. If very low signal detected, possibly stereo headphones or a cable with long GND connected. Step 408— If no clear mic bias, close 314, open 311, close 310, open 316 and measure mic input bias with 312. If normal mic bias detected, assume OMTP pinout headset connected. If very low signal detected, possibly stereo headphones or a cable with long GND connected. Step 410—If steps 406 and 408 show very low, under 4 ohms connection between pins L and R of connector 24, then assume a plug with long gad pin arrangement connected. This can be either stereo headphones or a stereo cable with long GND conductor. Step 412—After steps 402-410, transmit a low volume, preferably low frequency signal first from amplifier 304 and then from amplifier 302 and while keeping the switching arrangement of steps 406 or 408, ensure that no direct signal feedback take place to mic input 312. If GND selection is correct, then no feedback is detected. Step 414—If outcome was that we have a so called long GND plug inserted (outcome of step 410), then close both 314 and 316 for best possible grounding for stereo out only usecases without microphone. Step 316—If not sure of the outcome, a menu can be launched for the user to let him/her select the right ground (GND) setting based on known alternatives.

Referring now also to FIG. 7, a switching system 300A in accordance with a fourth embodiment is illustrated. The system 300A provides a variant of the system 300, wherein MOSFET switches 314A, 316A replace the switch circuits 314 and 316 comprising the bipolar transistors 320, 322. The functionality of the system 300A is the same as the system 300, but one difference is that there is no need for dynamic bias current adjustments in order to save power. Control current consumption of the system 300A is reduced from that of the system 300.

Referring now also to FIG. 8, a switching system 300B in accordance with a fifth embodiment is illustrated. The system 300B provides another variant of the system 300, wherein MEMS switches 314B, 316B replace the switch circuits 314 and 316 comprising the bipolar transistors 320, 322. This system 300B configuration provides the benefit of being down to 20 milli Ohms-level switching. The functionality of the system 300B is the same as in the system 300. The control current consumption of the system 30DB is reduced from that of the system 300 and off-state isolation characteristics, and on-state resistance, are improved from that of the system 300A.

It should be noted that the MEMS switches 314B, 316B may have ultra low (10 milli Ohms) ON resistance, high common mode range and high isolation. Additionally, multiple switch elements can be used in parallel to minimize ON resistance.

Figure 9:
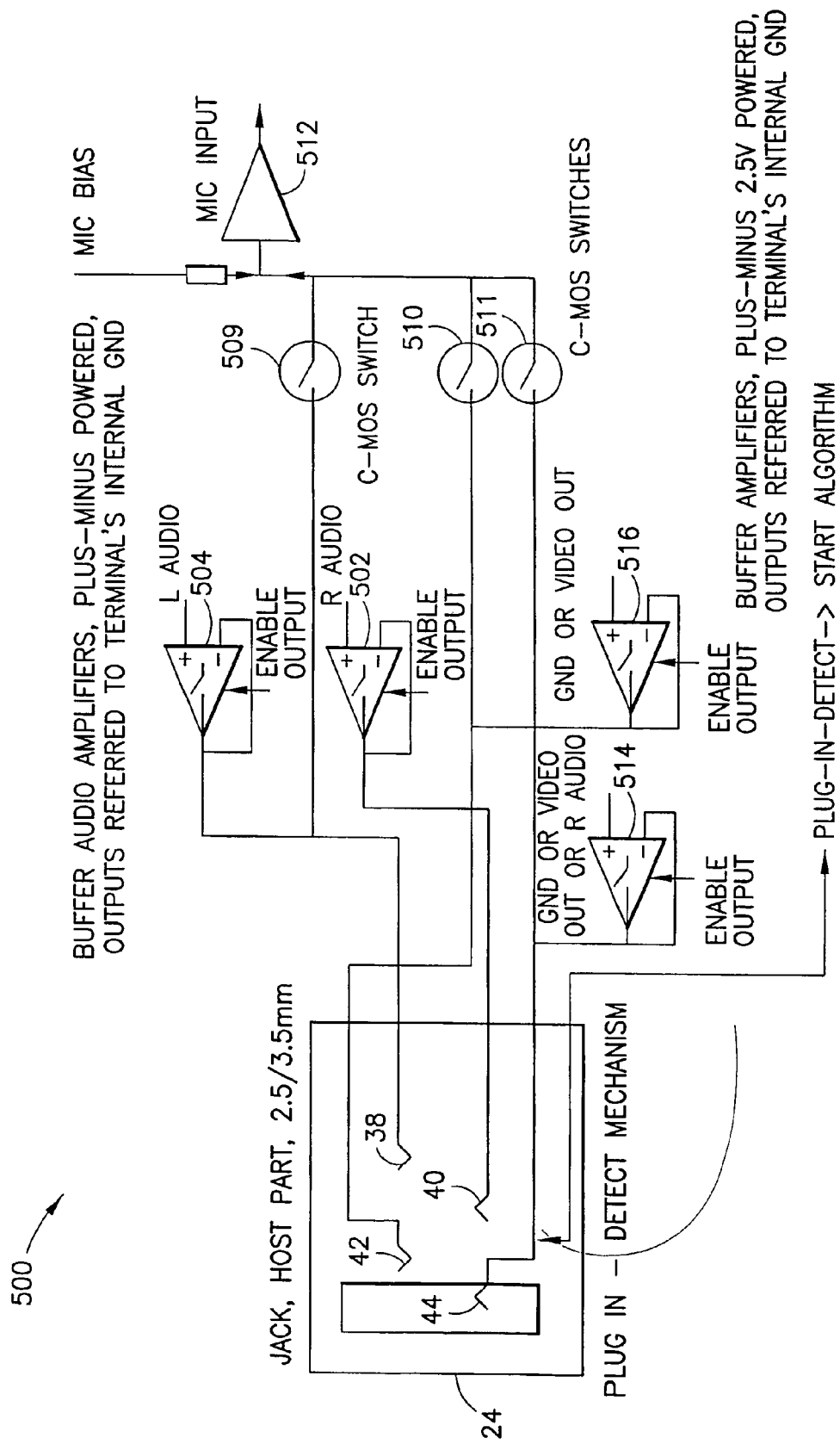
FIG. 9 is a schematic diagram of another exemplary switching system used in the electronic device shown in FIG. 1.

Referring now also to FIG. 9, a switching system 500 in accordance with a sixth embodiment is illustrated. Similar to the systems described above, the system 300 comprises a right channel audio amplifier (optional output switch) 502, a left channel audio amplifier (optional output switch) 504, microphone input isolation switch devices 509, 510, 511, a microphone input amplifier 512, and the headphone/headset output jack 24. The system 500 additionally comprises buffer amplifiers 514, 516. The system 500 provides a configuration where fully flexible routing of audio and video signals to all known contact combinations is possible. The use of the system 500 places more stringent requirements than the previous implementations on the output amplifiers in terms of operating voltage, bandwidth, and output power capability. A more limited implementation without video output capability is possible, placing less demand on the amplifier bandwidth. Such an implementation would still provide for full compatibility towards all audio-only headsets and connector cables.

It is to be understood that the disclosed switching system may be provided on any suitable portable audio and multimedia devices, including telecommunication terminal devices that have multi-contact circular connectors combining audio output and microphone input and/or video outputs.

The disclosed switching system allows for the position of the ground signal to be varied to any (reasonable) electrical contact within the same connector. The ground signal can be created by connecting the contact to the device ground via a suitable electronically controlled switching device (e.g. a saturated bipolar [NPN] transistor, a MOSFET switch, or a MEMS switch), or by driving the contact with an amplifier that has zero input.

Automatic detection may be provided for the most likely order (based on known conventional configurations) of electrical connections. Detection may be initiated when the system senses the insertion of a plug to the connector. This detection is often sensed with a mechanical switch, but other means of detection are possible and the exact mechanism of detection is not critical to the invention. Contact combinations can be limited to known commercial implementations, simplifying the search and reducing the ambiguity. The disclosed switching device may also provide for automatic routing of the signals to correspond to the detected order and connecting the bias signal and signal amplifier for a microphone to a suitable contact.

Several industry standard plug and socket configurations (such as OMTP aligned 2.5 mm or 3.5 mm connectors for audio and video comprising four conductors) provide arrangements to accept and detect 3-conductor standard headphones (no mic), video cable and standard analogue stereo audio cables. This is based on an assumption that the ground contact area of the plug makes connection on both sides properly. Currently, there are conventional configurations offering a cable where the ground contact area (or pin) is not at the OMTP specified location (i.e. the first contact area). This creates incompatibility and fragmentation on the market. In addition, a conventional CDMA pinout configuration, is available where the ground pin is at the same location with OMTP, but the microphone signal is positioned differently from that of OMTP, being at the tip or end of the plug.

Having market fragmentation risk, and deviation from OMTP taking place, there may end up to three type of connectors: OMTP (where 2.5 mm and 3.5 mm are the same and converter cables are standard cables and thus aligned), the alternative pinout configuration and CDMA with different pinouts in 2.5 mm and in 3.5 mm connector plugs. This would quickly generate a wide population of pin swapping converters and non-1:1 pinout cables. This results in a poor end user experience as the user would not be able to be sure of the cables and converters needed to provide a functional "direct" connection. Additionally, many of the connections between the different configurations of plugs and sockets may not work, since the pinout orientation may be wrong and not match between the connector and the device. This may be due to different ground (GND) or other signal positioning at the item to be connected to the terminal—or due to a non—1:1 adapter or cable in between the two. The invention solves the problem by automatically resolving the different pinout configurations and matching to the possible non-direct adapters and cables in between the terminal and the headset/headphone/TV/home amplifier/car/etc. that the connection is to be established with.

The invention provides many advantages over conventional configurations. For example, the invention allows the user to connect almost any headphone, headset, or connector cable directly to the portable device and receive full functionality (with no additional user involvement needed). A conventional manual setting by the user is impractical due to the large number of signal combinations, and trying out the combinations would be time consuming and lead to signals that are annoying or even potentially harmful to the devices or the user (e.g. routing video output signals to a headphone, an audio amplifier, or a microphone). Additionally, detecting the correct functionality would be difficult, as it would require playing back different signals (and in the case of video output, would require the display device to be active to detect the correct operation).

The invention also provides significant advantages over conventional configurations which use adapters between devices. Conventional mechanical conversion adapters and cables may cause even more incompatibility between devices. The adapters, adapter plugs, or cables that change the order of the contacts are easy to construct and may exist, but they reduce the reliability and generally only serve one combination at a time. With these adapters, the user does not know which adapter will solve the problem without having a multimeter to find the right ground arrangement. The invention enables the detection of correct pin order and configuration even if an adapter or cable changing the pin order (e.g. changing the order of ground and signal(s)) is used.

The invention is especially advantageous in cases where the different pinouts are requested by operators on different continents (such as North America, Asia, and Europe) where the industry standards may all be different and without the invention, the user has no way to gain interoperability. Without the invention, different hardware versions would be required for different markets. This disclosed innovation would solve the interoperability automatically.

It should be noted that various embodiments of the invention have been described with reference to a 2.5 mm and 3.5 mm round plug with three to four conductors. Alternate embodiments may include two conductors with 2.5 mm and 3.5 mm round plugs in addition to 2 to 3 conductor configurations with 6.3 mm plugs. Additionally, the disclosed switching invention may be provided in any suitable portable terminal or a computer or an MP3/media players, an enhancement/peripheral or an another similar device, or a car or a home media system with a cable or a converter therebetween. Furthermore, although the figures for the above described switching systems comprise a connector socket (configured to receive a connector plug) alternate embodiments may comprise a connector plug, or any other suitable connector configuration.

Figure 10:
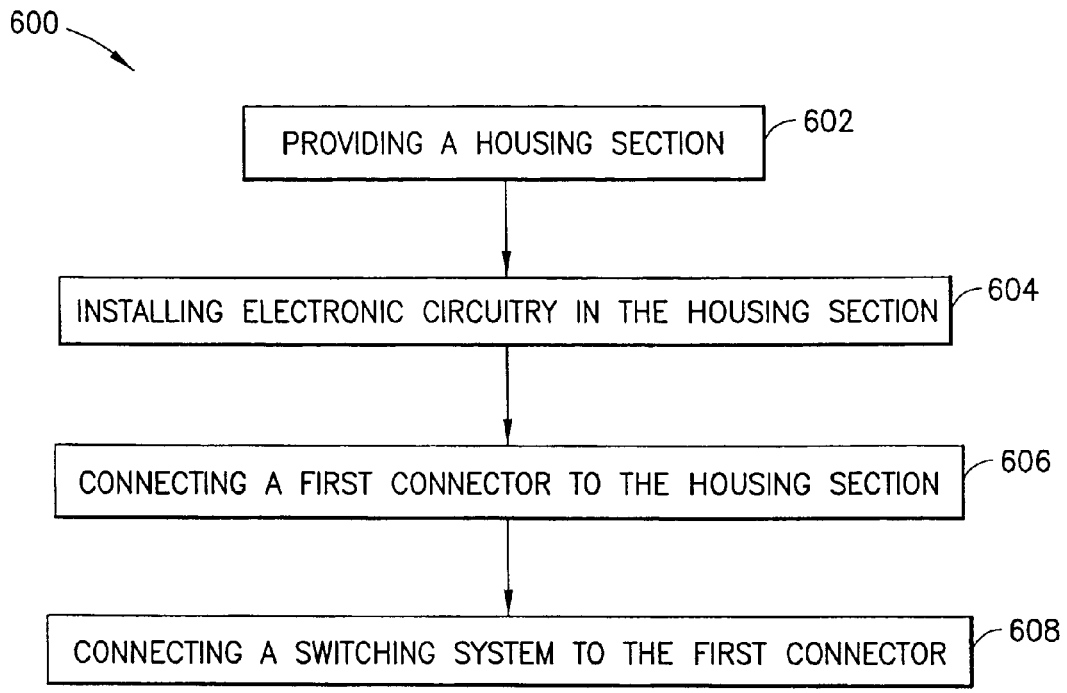
FIG. 10 is a block diagram of an exemplary method of manufacturing the electronic device shown in FIG. 1.

FIG. 10 illustrates a method 600 of manufacturing the electronic device. The method 600 includes the following steps. Providing a housing section (step 602). Installing electronic circuitry in the housing section (step 604). Connecting a first connector to the housing section, wherein the first connector is configured to receive a second connector having a first contact area and a second different contact area (step 606). Connecting a switching system to the first connector, wherein the switching system is configured to alternatively connect a ground of the electronic circuitry to the first or the second contact area (step 608). The above method may be implemented with configurations where the first connector comprises a connector socket and the second connector comprises a connector plug, or wherein the first connector comprises a connector plug and the second connector comprises a connector socket. However, any suitable connector configuration may be provided. It should be noted that any of the above steps may be performed alone or in combination with one or more of the steps.

Figure 11:
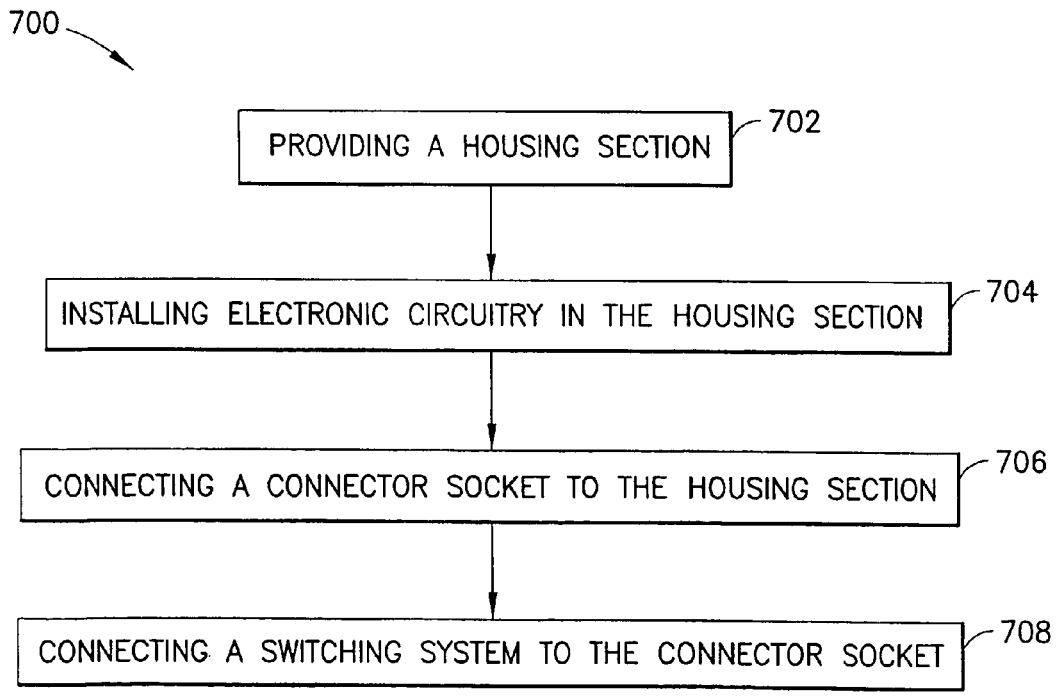
FIG. 11 is a block diagram of another exemplary method of manufacturing the electronic device shown in FIG. 1.

FIG. 11 illustrates a method 700 of manufacturing the electronic device. The method 700 includes the following steps. Providing a housing section (step 702). Installing electronic circuitry in the housing section (step 704). Connecting a connector socket to the housing section, wherein the connector socket is configured to alternatively receive a first connector plug having a first electrical configuration pattern and a second connector plug having a second different electrical configuration pattern (step 706). Connecting a switching system to the connector socket, wherein the switching system is configured to output a third electrical configuration pattern when the first connector plug is received, and wherein the switching system is configured to output the same third electrical configuration pattern when the second connector plug is received (step 708). It should be noted that any of the above steps may be performed alone or in combination with one or more of the steps.

Figure 12:
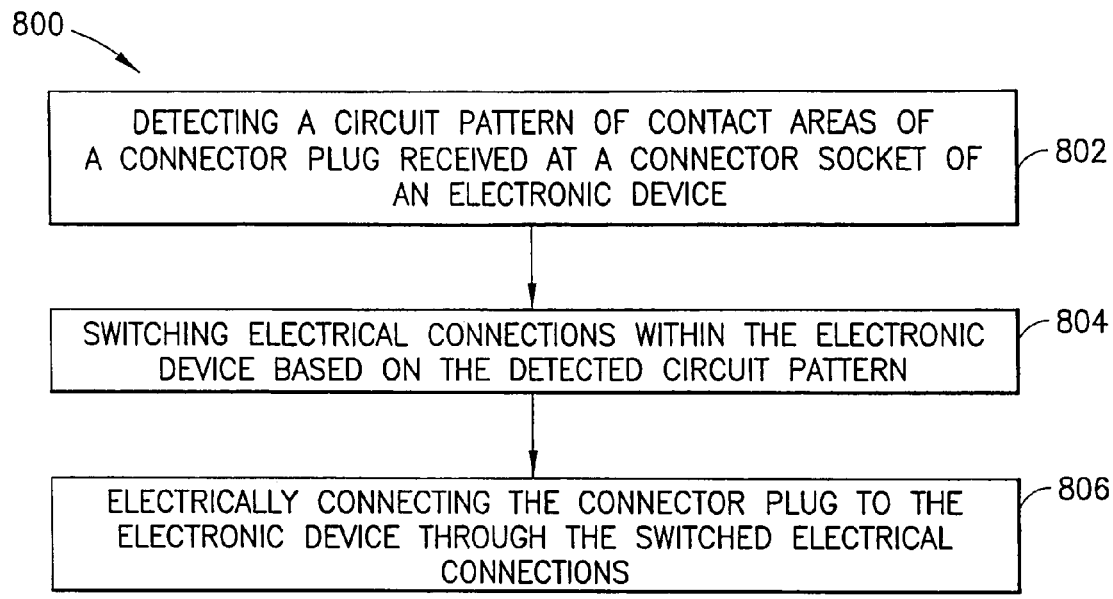
FIG. 12 is a block diagram of an exemplary method of switching electrical connections within the electronic device shown in FIG. 1.

FIG. 12 illustrates a method 800 of switching signals within the electronic device. The method 800 includes the following steps. Detecting a circuit pattern of contact areas of a connector plug received at a connector socket of an electronic device (step 802). Switching electrical connections within the electronic device based on the detected circuit pattern (step 804). Electrically connecting the connector plug to the electronic device through the switched electrical connections (step 806). It should be noted that any of the above steps may be performed alone or in combination with one or more of the steps.

Figure 13:
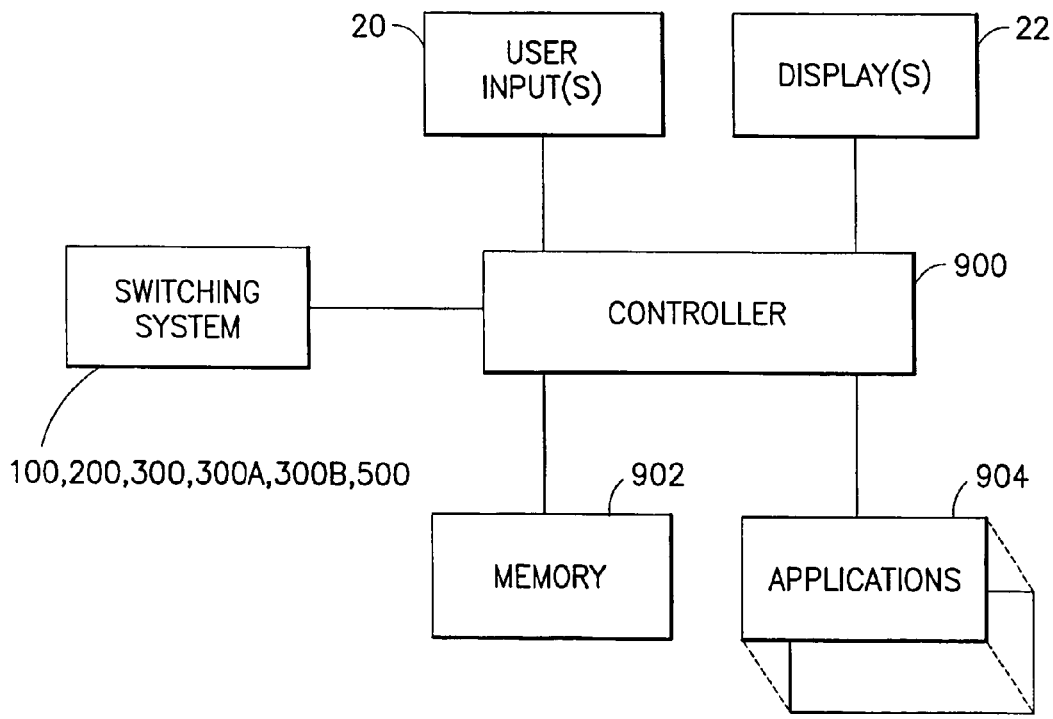
FIG. 13 is a schematic diagram illustrating components of the portable electronic device shown in FIG. 1.

Referring now also to FIG. 13, the device 10 generally comprises a controller 900 such as a microprocessor for example. The electronic circuitry includes a memory 902 coupled to the controller 900, such as on a printed circuit board for example. The memory could include multiple memories including removable memory modules for example. The device has applications 904, such as software, which the user can use. The applications can include, for example, a telephone application, an Internet browsing application, a game playing application, a digital camera application, etc. These are only some examples and should not be considered as limiting. One or more user inputs 20 are coupled to the controller and one or more displays 22 are coupled to the controller. The switching system 100, 200, 300, 300A, 300B, 400 are also coupled to the controller 100. The device 10 may programmed to automatically change signal configurations within the switching system when a plug is detected within the socket. However, in an alternate embodiment, this might not be automatic. The user might need to actively select a change in the application being used/run.

Figures 14, 15:
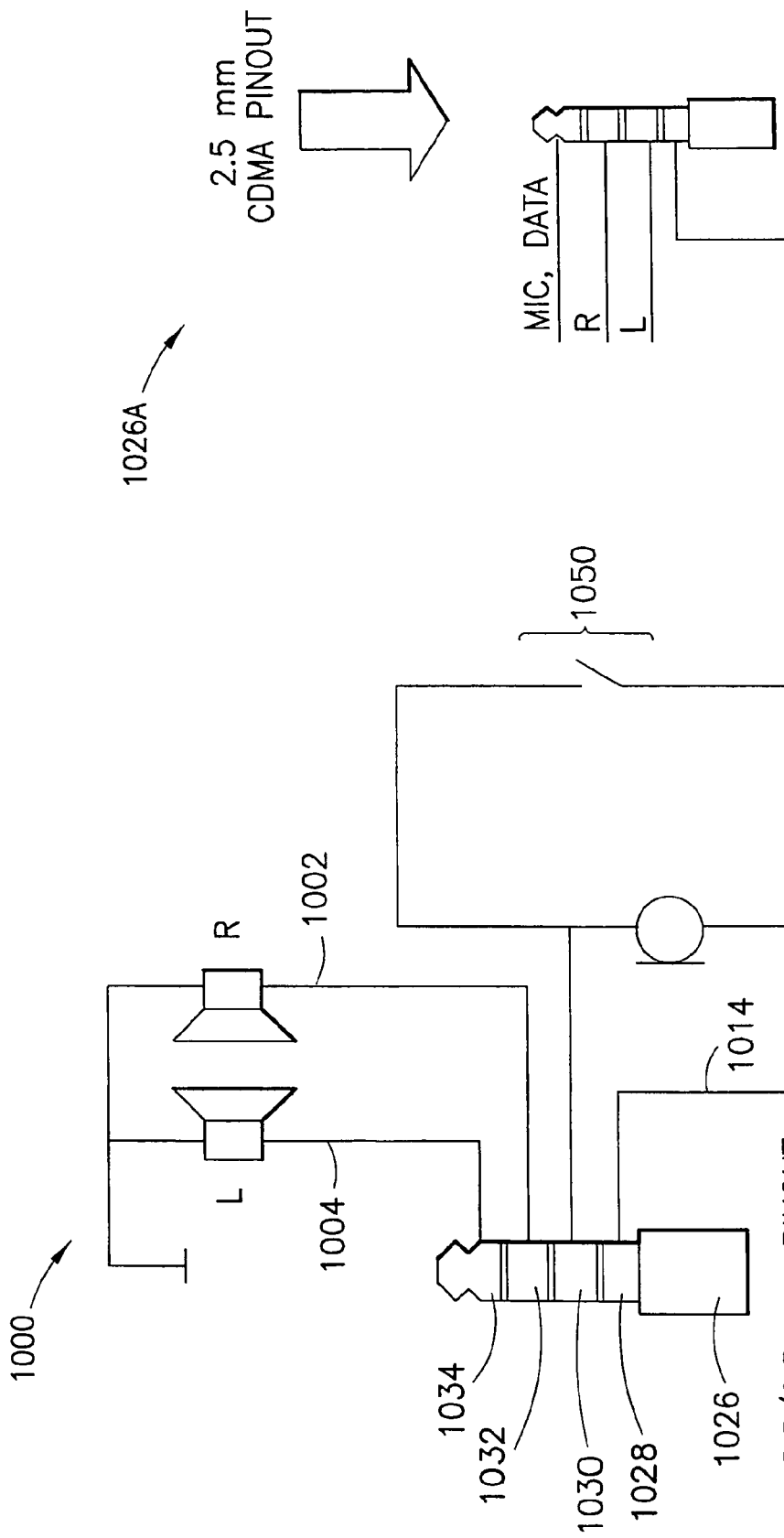
FIG. 14 is a schematic diagram of another exemplary switching system used with the electronic device shown in FIG. 1.
FIG. 15 is a schematic diagram of CDMA pinout configuration.

Referring now to FIG. 14, a switching system 1000, in accordance with a seventh embodiment is illustrated. Similar to the systems described above, the system 1000 comprises a right audio channel signal 1002, a left audio channel signal 1004, and a ground signal 1014. The system 1000 additionally comprises a so called "initiate call/terminate call" switch 1050 and a connector plug 1026. However, alternate embodiments may comprise a connector socket, or any other suitable type connector. The connector plug 1026 comprises contact areas 1028, 1030, 1032, 1034. The connector plug is configured to be insertable into a connector socket comprising mating contact areas. The system 1000 provides a configuration which may be used in a headset device for example.

The "initiate call/terminate call" switch 1050 may be a simple switch which is latch able and manually operated for example. The "initiate call/terminate call" switch 1050 is configured to short circuit the microphone signal in the headset as an indication to the phone or device to perform an action (such as terminate or wait for a spoken voice tag, for example). As shown in FIG. 14, the "hook-switch" 1050 could be permanently closed (zero ohms), thus providing the same configuration as a headphone connector plug with a "long GND" configuration.

The system 1000 allows for a headset to provide a "universal" configuration by having the latching hook-switch 1050 that could be set to closed state while using the headset as headphones in an airplane, with a PC, or with an MP3 player for example, that have any of the two GND settings in question.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. An apparatus comprising:
   a first connector configured to receive a second connector having a first contact area and a second different contact area, wherein the first contact area or the second contact area is a ground contact area; and
   a switching arrangement connected to the first connector, wherein the switching arrangement is configured to detect which of the first or second contact areas is the ground contact area, and wherein the switching arrangement is configured to automatically switch and connect a ground of the apparatus to the first or the second contact area based on the ground contact area.

2. The apparatus of claim 1 wherein the first connector comprises a connector socket, and wherein the second connector comprises a connector plug.

3. The apparatus of claim 2 wherein the connector socket is configured to receive a connector plug having at least three contact areas.

4. The apparatus of claim 2 wherein the connector socket further comprises at least three mating contact areas.

5. The apparatus of claim 1 wherein the switching arrangement comprises a saturated bipolar [NPN] transistor, a MOSFET switch, or a MEMS switch.

6. The apparatus of claim 1 wherein the first or the second contact area is driven with an amplifier that has a zero input.

7. The apparatus of claim 1 wherein the first connector comprises a connector plug, and wherein the second connector comprises a connector socket.

8. The apparatus of claim 1 wherein the switching arrangement comprises a manual switch.

9. An apparatus comprising:
   a connector socket configured to alternatively receive a first connector plug having a first electrical configuration pattern and a second connector plug having a second different electrical configuration pattern, wherein the first electrical configuration pattern comprises a first ground signal position and the second electrical configuration pattern comprises a second different ground signal position; and
   a switching arrangement connected to the connector socket, wherein the switching arrangement is configuration to automatically output a third electrical configuration pattern when the first connector plug is received in the socket, and wherein the switching arrangement is configured to automatically output the same third electrical configuration pattern when the second connector plug is received in the socket.

10. The apparatus of claim 9 wherein the connector socket comprises at least three mating contact areas.

11. The apparatus of claim 9 wherein the switching system arrangement comprises a saturated bipolar [NPN] transistor, a MOSFET switch, or a MEMS switch.

12. The apparatus of claim 9 wherein the connector socket is configured to, receive a circular multi-contact connector plug having a diameter of about 2.5 mm or 3.5 mm.

13. The apparatus of claim 9 wherein the first electrical configuration pattern comprises a first industry standard configuration and the second electrical configuration pattern comprises a second different industry standard configuration.

14. A method comprising:
    providing a housing section;
    installing electronic circuitry in the housing section;
    connecting a first connector to the housing section, wherein the first connector is configured to receive a second connector having a first contact area and a second different contact area, wherein the first contact area or the second contact area is a ground contact area; and
    connecting a switching arrangement to the first connector, wherein the switching arrangement is configured to detect which of the first or second contact areas is the ground contact area, and wherein the switching arrangement is configured to automatically switch and connect a ground of the electronic circuitry to the first or the second contact area based on the ground contact area.

15. The method of claim 14 wherein the first connector is a connector plug, and wherein the second connector is a connector socket.

16. The method of claim 15 wherein the connector socket is configured to detect an insertion of the connector plug.

17. The method of claim 14 wherein the first connector is a connector socket, and wherein the second connector is a connector plug.

18. A method comprising:
    providing a housing section;
    installing electronic circuitry in the housing section;
    connecting a connector socket to the housing section, wherein the connector socket is configured to alternatively receive a first connector plug having a first electrical configuration pattern and a second connector plug having a second different electrical configuration pattern, wherein the first electrical configuration pattern comprises a first ground signal position and the second electrical configuration pattern comprises a second different ground signal position; and
    connecting a switching arrangement to the connector socket, wherein the switching arrangement is configured to automatically output a third electrical configuration pattern when the first connector plug is received, and wherein the switching arrangement is configured to automatically output the same third electrical configuration pattern when the second connector plug is received.

19. A method comprising:
    detecting a circuit pattern of contact areas of a connector plug received at a connector socket of an electronic device;
    automatically switching electrical connections within the electronic device based on the detected circuit pattern, wherein the automatic switching of the electrical connections further comprises automatically switching a ground connection within the electronic device based on an automatically detected ground contact area of the circuit pattern; and
    electrically connecting the connector plug to the electronic device through the switched electrical connections.

20. A program storage device readable by a machine, tangibly embodying a program of instructions executable by the machine for performing operations to provide a connection between a first device and a second device, the operations comprising:
   detecting a circuit pattern of contact areas of a connector plug received at a connector socket of the first device, wherein the connector plug is connected to a second device;
   automatically switching electrical connections within the first device based on the detected circuit pattern, wherein the automatic switching of the electrical connections further comprises automatically switching a ground connection within the first device based on a detected ground contact area of the circuit pattern; and
   electrically connecting the second device to the first device through the switched electrical connections.

21. An apparatus as in claim 9 wherein the first connector plug and the second connector plug have the same number of contact areas.

UNITED STATES PATENT AND TRADEMARK OFFICE
CERTIFICATE OF CORRECTION

| | |
|---|---|
| PATENT NO. | : 8,362,654 B2 |
| APPLICATION NO. | : 12/313629 |
| DATED | : January 29, 2013 |
| INVENTOR(S) | : Inha et al. |

It is certified that error appears in the above-identified patent and that said Letters Patent is hereby corrected as shown below:

In the Claims:

Claim 11, col. 11, line 62 delete "system" after switching.

Signed and Sealed this
Seventh Day of May, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,362,654 B2 | Page 1 of 1 |
| APPLICATION NO. | : 12/313629 | |
| DATED | : January 29, 2013 | |
| INVENTOR(S) | : Inha et al. | |

It is certified that error appears in the above-identified patent and that said Letters Patent is hereby corrected as shown below:

In the Claims:

Claim 9, col. 11, line 53 "configuration" should be deleted and --configured-- should be inserted.

Signed and Sealed this
First Day of July, 2014

Michelle K. Lee
*Deputy Director of the United States Patent and Trademark Office*